United States Patent [19]

Truesdale

[11] Patent Number: 5,644,899

[45] Date of Patent: Jul. 8, 1997

[54] METHOD FOR PACKAGING SEMICONDUCTOR COMPONENTS FOR SHIPMENT

[75] Inventor: Robert Truesdale, Dripping Springs, Tex.

[73] Assignee: Motorola, Inc., Schaumburg, Ill.

[21] Appl. No.: 578,134

[22] Filed: Dec. 26, 1995

[51] Int. Cl.[6] .................................................. B65B 35/50
[52] U.S. Cl. ........................ 53/447; 206/204; 206/719; 206/459.1; 53/471; 53/485
[58] Field of Search ........................ 53/471, 474, 447, 53/485; 206/204, 721, 719, 714, 713, 459.1, 499, 526

[56] References Cited

U.S. PATENT DOCUMENTS

| | | | |
|---|---|---|---|
| 2,446,361 | 7/1948 | Clibbon | 312/31.1 |
| 2,459,400 | 3/1949 | Williams | 206/46 |
| 3,958,746 | 5/1976 | Wilbur | 206/449 |
| 4,091,921 | 5/1978 | Lewis | 206/363 |
| 4,098,577 | 7/1978 | Halpern | 23/232 |
| 4,206,844 | 6/1980 | Thukamoto et al. | 206/439 |
| 4,480,747 | 11/1984 | Kazor et al. | 206/721 |
| 4,528,222 | 7/1985 | Rzepecki et al. | 428/35 |
| 4,529,087 | 7/1985 | Neal et al. | 206/328 |
| 4,579,223 | 4/1986 | Otsuka et al. | 206/204 |
| 4,579,246 | 4/1986 | Swearingen et al. | 53/485 |
| 4,592,192 | 6/1986 | Jacob et al. | 53/512 |
| 4,597,244 | 7/1986 | Pharo | 53/434 |
| 4,677,809 | 7/1987 | Long et al. | 53/427 |
| 4,681,218 | 7/1987 | Williams | 206/204 |
| 4,752,002 | 6/1988 | Takahashi et al. | 206/204 |
| 4,793,123 | 12/1988 | Pharo | 53/449 |
| 4,799,350 | 1/1989 | Rias | 53/449 |
| 4,813,791 | 3/1989 | Cullen et al. | 383/40 |
| 4,825,624 | 5/1989 | Calcerano | 53/447 |
| 4,861,632 | 8/1989 | Caggiano | 428/35.2 |
| 4,867,038 | 9/1989 | Thorstenson | 206/713 |
| 4,872,558 | 10/1989 | Pharo | 206/522 |
| 4,874,093 | 10/1989 | Pharo | 206/522 |
| 4,918,904 | 4/1990 | Pharo | 53/472 |
| 4,923,059 | 5/1990 | Evers et al. | 206/265 |
| 4,949,530 | 8/1990 | Pharo | 53/449 |
| 4,966,280 | 10/1990 | Bradford | 206/721 |
| 4,969,750 | 11/1990 | Russo et al. | 383/113 |
| 4,971,196 | 11/1990 | Kitamura et al. | 206/328 |
| 5,009,308 | 4/1991 | Cullen et al. | 53/440 |
| 5,043,195 | 8/1991 | Skrivseth | 428/35.3 |
| 5,224,373 | 7/1993 | Williams et al. | 73/29.02 |
| 5,272,856 | 12/1993 | Pharo | 53/472 |
| 5,299,408 | 4/1994 | Dupont | 53/471 |
| 5,318,181 | 6/1994 | Stover et al. | 206/714 |
| 5,353,574 | 10/1994 | Copham et al. | 53/449 |

FOREIGN PATENT DOCUMENTS

| | | | |
|---|---|---|---|
| 512579 | 11/1992 | European Pat. Off. | 206/204 |
| 2-109883 | 4/1990 | Japan . | |
| 404031267 | 2/1992 | Japan | 206/204 |
| 404327155 | 11/1992 | Japan | 206/204 |
| 559134 | 2/1975 | Switzerland | 206/459.1 |

OTHER PUBLICATIONS

"AmeriStar Packaging competition," Duncan, et al., Motorola Manufacturing Systems; Oct. 19, '94.

*Primary Examiner*—John Sipos
*Assistant Examiner*—John Paradiso

[57] ABSTRACT

Airtight ESD-protected containers (42) are used to transport semiconductor components (12). A reclosable lid (44) snaps onto the rectangular container (42) to provide the airtight environment. The shape of the container allows stacking of multiple containers inside a larger outer box for shipping to the customer site. Both the lid and the container are reusable which provides cost savings spread over their useful life. Transporting semiconductor components in this manner does not use small cardboard boxes or dry-pack bags.

20 Claims, 2 Drawing Sheets

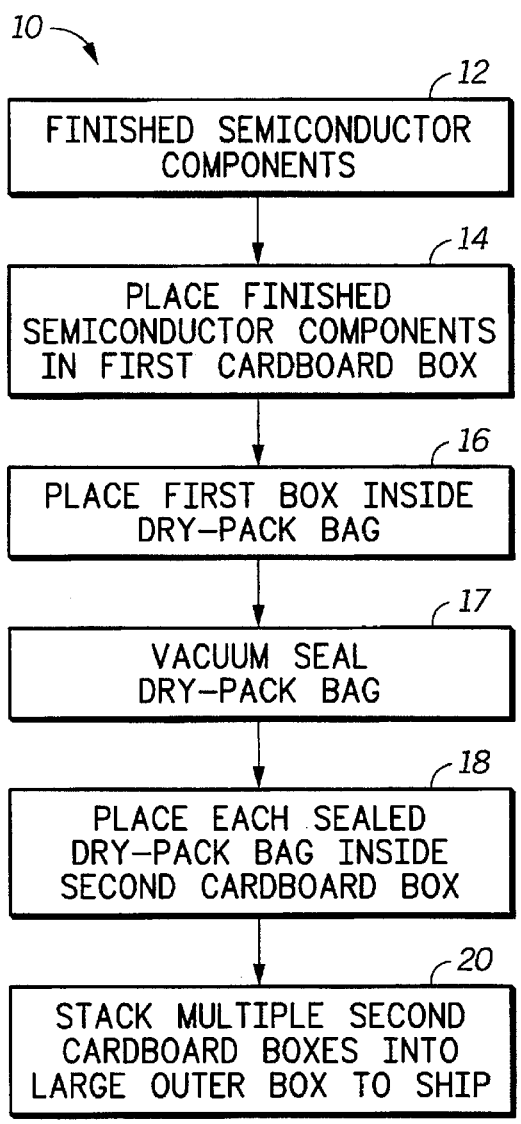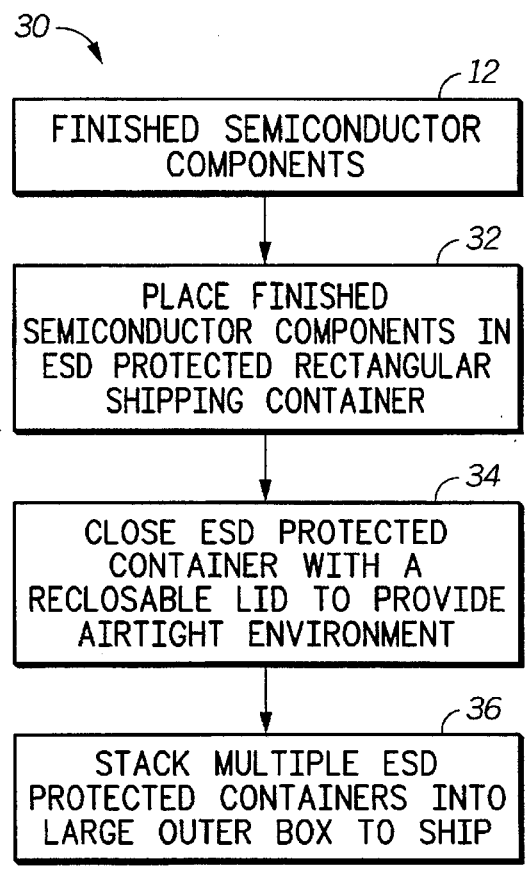
FIG.1
-PRIOR ART-
FIG.2

5,644,899

METHOD FOR PACKAGING SEMICONDUCTOR COMPONENTS FOR SHIPMENT

FIELD OF THE INVENTION

The present invention relates generally to shipping containers and more specifically to containers for transporting semiconductor components that require dry-packing.

BACKGROUND OF THE INVENTION

Plastic encapsulated semiconductor components are susceptible to moisture ingress due to the permeable nature of plastic molding compounds. Components containing moisture levels exceeding some critical amount run the risk of cracking or "popcorning" during the rapid heating of the solder reflow operation for board mounting. Components which are subject to cracking are normally baked in an oven for a predetermined length of time to drive moisture out of the components before they are shipped to the customer. These components are packaged in "dry-packs" after baking to ensure that they are protected from moisture and will arrive dry at the customer site.

FIG. 1 is a flow chart of the current shipping process 10 which involves placing baked, finished semiconductor components (provided in a step 12) inside a first small cardboard box (a step 14). This first cardboard box is then placed inside a flexible dry-pack bag with desiccant (a step 16). The dry-pack bag is evacuated and sealed to protect the components (a step 17). Each dry-pack bag containing semiconductor components is then placed inside a second larger cardboard box (a step 18). Then, these second larger cardboard boxes are stacked inside a third large shipping cardboard box which is shipped to the customer (a step 20). Once the customer receives the shipment, the customer must unpack the components from all the cardboard boxes and the dry-pack bags. All the cardboard boxes and the used dry-pack bags must be discarded because they are not reusable or recycleable. This translates into a large volume of trash that is continually being generated which is not ecologically efficient or environmentally friendly.

Thus a need exists for improving the method in which semiconductor components are shipped which eliminates inefficiencies while still protecting moisture sensitive components from reabsorbing ambient moisture after being baked.

BRIEF DESCRIPTION OF THE DRAWINGS

FIG. 1 is a flow chart of the prior art method for shipping semiconductor components.

FIG. 2 is a flow chart of a method for shipping semiconductor components in accordance with the present invention.

DETAILED DESCRIPTION OF A PREFERRED EMBODIMENT

The present invention allows a simple and efficient way to package semiconductor components for shipping. By utilizing rectangular airtight containers composed of electrostatic-discharge (ESD) protected material to store and ship semiconductor components, several stages of boxing components in cardboard boxes are eliminated. After being baked or otherwise prepared for shipping to the customer, the semiconductor components are placed directly inside the ESD-protected box along with desiccant. A lid is then snapped onto the container to provide an airtight environment. Multiple ESD-protected containers holding the semiconductor components are stacked inside a larger box used for transport to the customer site. Once the customer has removed the semiconductor components from the ESD-protected airtight containers, these containers can be returned to the semiconductor component manufacturer for reuse. This method eliminates the wasteful discarding of numerous cardboard boxes with every shipment of semiconductor components.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

FIG. 2 is a flow chart of a shipping method 30 of the present invention. Finished semiconductor components are provided in a step 31 which are ready to be shipped to another site or to the customer. "Finished" means that the components have been assembled into whatever form is required, whether plastic, metal or ceramic and whether surface mount, through-hole, or molded carrier ring (MCR). Additionally, finished components include those that have been tested, burned-in, and/or baked (for moisture protection). Once provided, the finished semiconductor components are placed in an ESD protected rectangular shipping container in accordance with a step 32 of the present invention. If the semiconductor components are typically handled in trays or in an Ammo Pak, they can be simply placed inside the rectangular shipping container of the present invention. The term "Ammo Pak" refers to a particular process in which MCR devices are strung together with metallized tape which maintains a precise given pitch for each MCR size. The metallized tape is thin and flexible to allow a fan-folding of the devices across the width of a length of a box. The end user or customer of the devices unloads the devices by pulling the string of devices from the box in the manner of an ammunition bandoleer for a machine gun.

Figure 3:
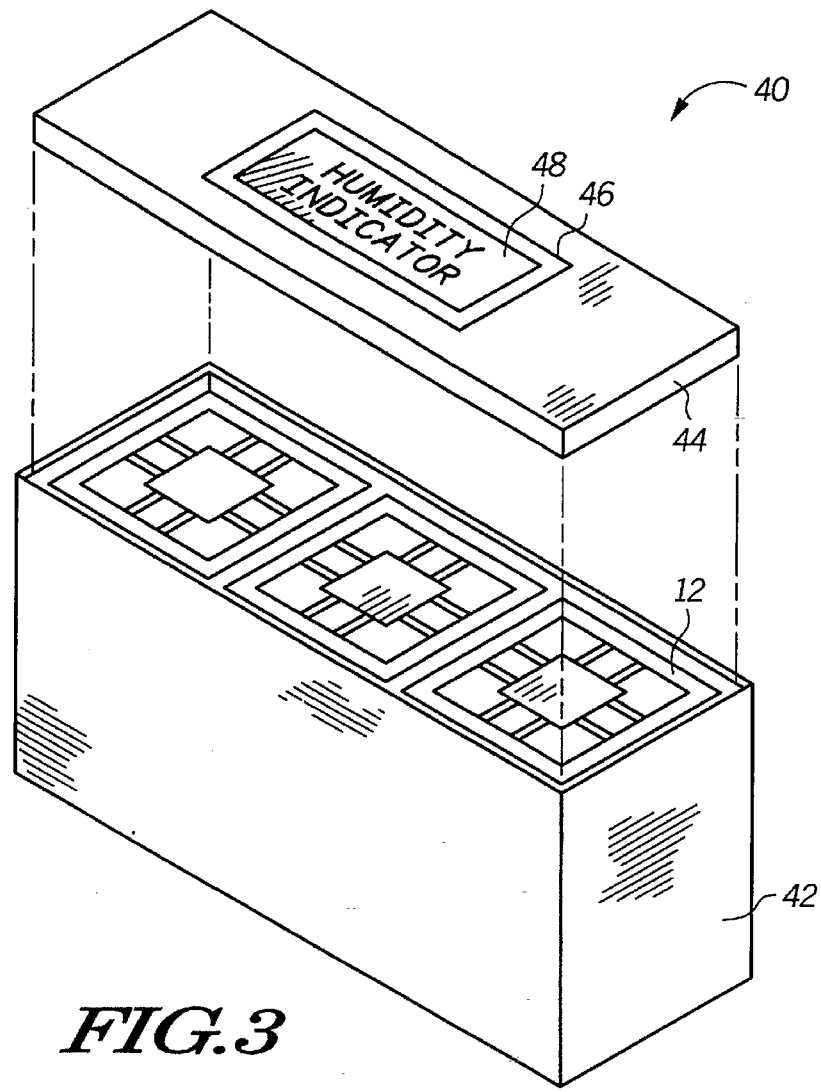
FIG. 3 illustrates a rectangular shipping container and a reclosable lid of the present invention.

An embodiment of the rectangular shippping container 42 is illustrated in FIG. 3. The particular size of the shipping container 42 depends upon the method by which semiconductor components are handled. For example, if the semiconductor components are handled in trays, then the rectangular shipping container should be accordingly sized so that a tray can be placed inside the container without excessive clearance around the perimeter of the tray to prevent needless movement of the tray inside the container. If the semiconductor components are handled in the Ammo Pak format, then they can simply be folded into the container, such as depicted in FIG. 3.

Once the semiconductor components are placed inside the shipping container, a lid 44 is used to seal the container, as indicated in a step 34. The lid 44 is intended to snap-on to provide an airtight seal for the container. Thus, it is important that the container and lid be manufactured with sufficiently tight tolerances to ensure a tight seal. Such know-how is a skill possessed by plastic molding manufacturers.

An important component of the shipping container and lid is the material used to make them. Since they are being used to transport semiconductor components, ESD-protection is a must because no dry-pack bags are used. Where the dry-pack bags were coated with an ESD-protective material in the prior art method, the present method requires that the container box itself be ESD-protected. It is preferred that the material be a volumetric ESD-protected material, meaning that the base polymer is impregnated or filled with the static-dissipative material, as opposed to being coated on a surface with the static-dissipative material. Furthermore, a material that is humidity-independent is desirable for the shipping container and lid, so that regardless of ambient humidity conditions, the material functions properly to dissipate charge. Additionally, it may be desirable to select a material that is clean-room-compatible since semiconductor components are often manufactured and then stored in clean-room environments. A material developed by AT&T and manufactured by Acrotech called Static Intercept is suitable for making the shipping container and lid in practicing the present invention.

One advantage to this method over the prior art is that the semiconductor components are not put inside a first cardboard box (step 14 in FIG. 1) or inside a dry-pack bag (step 16 in FIG. 1). The cardboard boxes are not ESD-protected so the dry-pack bags are generally coated with an ESD-protected material. These first cardboard boxes and dry-pack bags are not reusable once opened, and must be discarded which generates a large volume of trash.

The present invention eliminates the use of these first cardboard boxes and conventional dry-pack bags with the use of a reusable ESD protected container which provides an air-tight environment for the semiconductor components. Nonetheless, there is a need to be able to transport these reusable containers to subsequent user. Accordingly, in practicing the present invention one may desire to stack multiple reusable, ESD protected containers of the present invention into a larger outer box to ship to such subsequent user, as indicated by a step 36 of process flow 30. Thereafter, the outer box is shipped or transported to the user, as indicated by a step 37. Such a large outer box may be a cardboard box as is used in prior art semiconductor shipping techniques (for example, as in step 20). Despite the use of a larger outer cardboard box, the present invention significantly reduces waste generated from semiconductor component shipping as compared to prior art techniques, since the first and second cardboard boxes of the prior art (as in steps 14 and 18) and the dry-pack backs (as in step 16) are eliminated in practicing the present invention.

Upon receipt, the user removes the semiconductor components from the ESD protected containers and returns the empty containers to the semiconductor component manufacturer for subsequent reuse. This is indicated in process flow 30 as a step 38. Because the containers are returned, the user does not have to dispose of as much trash as in prior art practices, having only to dispose of the outer box which contained the stack of ESD protected containers.

Figure 4:
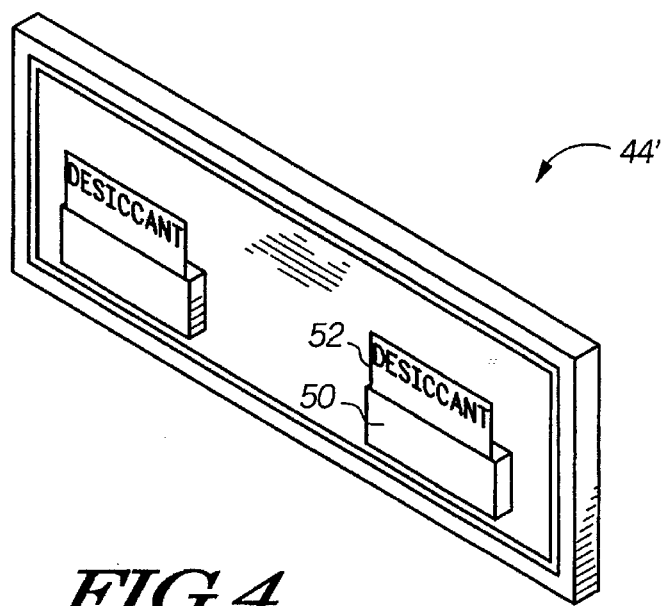
FIG. 4 illustrates a lid having a compartment for holding a desiccant in accordance with the invention.

If the semiconductor components are moisture sensitive, a desiccant material can be placed inside the rectangular shipping container along with the semiconductor components. The desiccant absorbs moisture from the environment to prevent moisture from being absorbed by the components themselves. Any of the desiccant materials commercially available and known in the art may be suitable for use in practicing the present invention. Although the desiccant, which are typically packaged in small individual packets, can simply be placed loose inside the rectangular shipping container with the semiconductor components, an alternative is to place it in the lid to the rectangular container, as illustrated in FIG. 4. A lid 44 may be designed to have pockets 50 wherein packets of desiccant 52 may be simply placed inside the pockets.

Additionally, it may be desirable to have a humidity indicator inside the rectangular shipping container to monitor the humidity level in the container. One reason why this would be important is that many components are specified or only guaranteed to function properly provided that they have not been exposed to an atmosphere or environment containing moisture or humidity above a certain level, such as 30% relative humidity. Therefore, it is important for the user to know upon receiving the shipment of semiconductor components whether they have been stored under sufficiently dry conditions. And while it is possible to simply place the humidity indicator card on top of the semiconductor components so that the humidity indicator is plainly visible upon opening the container, an alternative is to have a transparent window 46 in the lid 44 so that the humidity indicator card 48 can be read or seen without opening the lid. In this manner, the shipping container is maintained in its airtight condition until the user is ready to remove the semiconductor components from the container.

The foregoing description and illustrations contained herein demonstrate many of the advantages associated with the present invention. In particular, it has been revealed that several stages of cardboard boxes and use of dry-pack bags can be eliminated to reduce cycle time by practicing the present invention. Moreover, the ESD-protected airtight containers in the present method is reusable which offers cost savings over the life of the containers. Yet another advantages is that the present invention it is environmentally friendly by reducing the amount of garbage generated in the transport of semiconductor components.

Thus it is apparent that there has been provided, in accordance with the invention, a method for transporting semiconductor components that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the container and lid may be made with a polymer that is then coated with a static-dissipative material in order to protect the contents from ESD. In addition, the invention is not limited to any particular size of the container since the size may be dependent on the size of the contents. Furthermore, it may be possible to stack multiple airtight containers inside another reusable shipping container for transport instead of using large cardboard boxes which must be discarded. Therefore, it is intended that this invention encompasses all such variations and modifications falling within the scope of the appended claims.

I claim:

1. A method for packaging moisture sensitive semiconductor components comprising the steps of:

providing a plurality of semiconductor components, each being encapsulated in a plastic package body capable of absorbing moisture;

providing a rectangular shipping container, wherein the rectangular shipping container is composed of a polymer-based, volumetric electrostatic-discharge-protected material;

placing the plurality of semiconductor components into the rectangular shipping container;

sealing the rectangular shipping container with a reclosable lid to provide an airtight environment for the plurality of semiconductor components contained in the rectangular shipping container, wherein the reclosable lid is also composed of an electrostatic-discharge-protected material; and stacking the rectangular shipping container having the plurality of semiconductor components therein into an outer box for transporting the plurality of semiconductor components to a user, wherein the rectangular shipping container and the reclosable lid are reusable for shipping other semiconductor components.

2. The method of claim 1, further comprising the step of placing a desiccant material inside the rectangular shipping container to absorb moisture inside the airtight environment.

3. The method of claim 1, further comprising the step of placing a humidity sensor indicator inside the rectangular shipping container to monitor humidity inside the airtight environment.

4. The method of claim 1, wherein the step of providing the plurality of semiconductor components provides said semiconductor components strung together with a flexible tape to allow fan-folding of a string of semiconductor components.

5. The method of claim 1, wherein the step of placing the plurality of semiconductor components into the rectangular shipping container places the plurality of semiconductor components into a container made of a humidity-independent static protection polymer that is also clean-room-compatible.

6. A method for transporting moisture-sensitive semiconductor components comprising the steps of:

providing a plurality of semiconductor components which is not contained inside a dry-pack bag;

plating the plurality of semiconductor components into a rectangular shipping container, wherein the rectangular shipping container is composed of a polymer-based volumetric electrostatic-discharge-protected material;

placing a desiccant inside the rectangular shipping container to absorb moisture inside the rectangular shipping container to protect the semiconductor components;

sealing the rectangular shipping container with a reclosable lid to provide an airtight environment for the plurality of semiconductor components and desiccant contained therein;

placing the rectangular shipping container having the plurality of semiconductor components therein into an outer box for transporting the plurality of semiconductor components; and reusing the rectangular shipping container and the reclosable lid by refilling the rectangular shipping container with another plurality of semiconductor components.

7. The method of claim 6, wherein the step of providing the plurality of semiconductor components provides said semiconductor components strung together with a flexible tape to allow fan-folding of a string of semiconductor components.

8. The method of claim 6, wherein the step of placing the plurality of semiconductor components into the rectangular shipping container places the plurality of semiconductor components into a container made of a humidity-independent static protection polymer that is also clean-room-compatible.

9. The method of claim 8, wherein the step of sealing with the reclosable lid uses a same polymer material for the reclosable lid as for the rectangular shipping container.

10. The method of claim 6, wherein the step of sealing with the reclosable lid provides said lid having a compartment for holding the desiccant on an inner surface of said reclosable lid.

11. The method of claim 6, further comprising the step of placing a humidity sensor indicator inside the rectangular shipping container immediately prior to sealing said rectangular shipping container for monitoring humidity conditions inside the airtight environment.

12. The method of claim 11, wherein the step of sealing with the reclosable lid provides said reclosable lid having a viewing window for checking the humidity sensor indicator without having to open the reclosable lid in order to maintain the airtight environment until a semiconductor component is to be removed from the rectangular shipping container.

13. The method of claim 6 wherein the step of stacking comprising stacking in an outer box composed of a non-electrostatic-discharge-protected material.

14. A method for packaging semiconductor components comprising the steps of:

providing a plurality of semiconductor components;

placing the plurality of semiconductor components into a rectangular shipping box without a dry-pack bag, wherein the rectangular shipping box is composed of a polymer-based volumetric electrostatic-discharge-protected material;

placing a desiccant inside the rectangular shipping box to absorb moisture inside the rectangular shipping box to protect the plurality of semiconductor components;

sealing the rectangular shipping box with a reclosable lid to provide an airtight environment for the plurality of semiconductor components and the desiccant contained therein, wherein the reclosable lid is also composed of an electrostatic-discharge-protected material; and stacking the rectangular shipping box and a plurality of like rectangular shipping boxes into an outer box for transporting the plurality of semiconductor components, wherein the outer box is made of a material without electrostatic-discharge-protection.

15. The method of claim 14, wherein the step of placing the plurality of semiconductor components into the rectangular shipping box places the plurality of semiconductor components into a box made of a humidity-independent static protection polymer that is also clean-room-compatible.

16. The method of claim 15, wherein the step of sealing with the reclosable lid uses a same polymer material for the reclosable lid as for the rectangular shipping box.

17. The method of claim 14, wherein the step of sealing with the reclosable lid provides said reclosable lid having a compartment for holding the desiccant on an inner surface of said reclosable lid.

18. The method of claim 14, further comprising the step of placing a humidity sensor indicator inside the rectangular shipping box immediately prior to sealing said rectangular shipping box for monitoring humidity conditions inside the airtight environment.

19. The method of claim 18, wherein the step of sealing with the reclosable lid provides said reclosable lid having a viewing window for checking the humidity sensor indicator without having to open the reclosable lid in order to maintain the airtight environment until a semiconductor component is to be removed from the rectangular shipping box.

20. The method of claim 14 wherein the step of stacking comprises stacking in an outer box composed of cardboard.

* * * * *